United States Patent [19]
Biery et al.

[11] Patent Number: 5,470,788
[45] Date of Patent: Nov. 28, 1995

[54] METHOD OF MAKING SELF-ALIGNED, LATERAL DIFFUSION BARRIER IN METAL LINES TO ELIMINATE ELECTROMIGRATION

[75] Inventors: Glenn A. Biery, Poughkeepsie, N.Y.; Daniel M. Boyne, Austin, Tex.; Hormazdyar M. Dalal, Milton, N.Y.

[73] Assignee: International Business Machines Corporation, Armonk, N.Y.

[21] Appl. No.: 203,158

[22] Filed: Feb. 28, 1994

[51] Int. Cl.$^6$ ............................................. H01L 21/441
[52] U.S. Cl. ........................... 437/190; 437/192; 437/194; 437/957
[58] Field of Search .................................. 437/190, 192, 437/194, 197, 957

[56] References Cited

U.S. PATENT DOCUMENTS

| | | | |
|---|---|---|---|
| 3,813,263 | 5/1974 | Rosenberg | 437/957 |
| 4,154,874 | 5/1979 | Howard et al. | 437/197 |
| 4,636,404 | 1/1987 | Raffel et al. | 437/194 |
| 4,826,785 | 5/1989 | McClure et al. | 437/194 |
| 5,101,261 | 3/1992 | Maeda | 437/957 |

FOREIGN PATENT DOCUMENTS 4-67635(A)   3/1992   Japan.

OTHER PUBLICATIONS

R. G. Filippi, et al., "Evidence of the Electromigration Short–Length Effect in Aluminum–Based Metallurgy W/Tungsten Diffusion Barriers" Mat. Res. Soc. Symp., Proc. V. 309, pp. 141–148, 1993 Materials Research Society. (no month).

*Primary Examiner*—Chandra Chaudhari
*Attorney, Agent, or Firm*—H. Daniel Schnurmann

[57] ABSTRACT

A method of providing interconnections to a semiconductor integrated chip designed to eliminate electromigration. The method includes the steps of forming an interconnection with segments of Al interspersed with segments of a refractory metal, wherein each aluminum segments is followed by a segment of refractory metal, aligning the aluminum and refractory metal segments with respect to each other ensuring electrical continuity.

12 Claims, 6 Drawing Sheets

METHOD OF MAKING SELF-ALIGNED, LATERAL DIFFUSION BARRIER IN METAL LINES TO ELIMINATE ELECTROMIGRATION

FIELD OF THE INVENTION

The present invention is generally related to semiconductor devices and, more particularly, to the design of metal contacts and interconnections for semiconductor integrated circuits to eliminate electromigration failure. The invention also relates to providing various processes for obtaining the designed structure.

BACKGROUND OF THE INVENTION

The reliability of aluminum-based interconnections in microelectronic circuits is generally limited by a phenomenon known as electromigration. As microelectronic circuits are made more dense in order to improve performance, the electric fields (and resulting current densities) in the aluminum interconnects increase. Hence, as circuit densities increase, the rate of electromigration also increases.

Electromigration leads to circuit failure primarily via two mechanisms. In the first, aluminum electromigrates away from a region in the interconnect faster than the availability of additional atoms can take its place. This process generates a void in the interconnection. Growth of this void increases the electrical resistance of the interconnection to a point where circuit failure occurs. The second means by which electromigration failure occurs is when metal electromigrates into a region faster than it escapes the region, thus locally piling up metal atoms (called extrusions) to a point where it extends to the adjacent interconnection line, thereby causing an electrical short circuit.

The problem of electromigration has been approached in a number of ways, the two most common are: (1) introducing a second species into the parent metal, e.g., alloying aluminum with a 0.2% to 4% copper, and (2) utilizing a redundant metal layer, e.g., titanium, tungsten or chromium layer(s) under and/or over the aluminum lines.

The addition of Cu into the Al line has been described by Ames, et al., in U. S. Pat. No. 3,879,840, and of common assignee. The formation of a thin intermetallic layer within the Al-Cu has been described by J. K. Howard in U.S. Pat. Nos. 4,017,890 and 4,154,874, and of common assignee. While the above methods increase electromigration lifetime, it has been found that electromigration failure cannot be totally avoided because void growth cannot completely be suppressed, i.e., void sizes increase with time. The use of redundant layers can extend the electromigration lifetime of metal lines by a factor of 10 to 100 over non-redundant schemes. The present invention, however, offers a lifetime extension in excess of 1000×. This is because with the present invention, void growth is totally eliminated, which is made possible by a phenomenon known as the short-length effect.

The short-length effect takes place in short aluminum interconnections if an electrical current is supplied through leads of materials in which aluminum diffusivity is low. The physical origin of the short-length effect is the build-up of backstress as aluminum atoms pile up against the diffusion barrier leads; this backstress counteracts the electromigration driving force. A steady-state condition arises in situations where the backstress exactly balances the electromigration driving force. Under this condition, no further electromigration damage results.

The existence of the short-length effect has been demonstrated by several investigators as, for instance, by H. V. Schreiber in the article: "Electromigration Threshold of Aluminum Films" published in Solid State Electronics, Vol. 28, No. 6, p. 617, by R. G. Filippi, et al., in the article: "Evidence of the Electromigration Short-Length Effect in Aluminum based Metallurgy with Tungsten Diffusion Barriers" published in the Proceedings of the Materials Research Symposium, Vol. 309, pp. 141–148, and by X. X. Li et al., in the article: "Increase in Electromigration Resistance by Enhancing Backflow Effect" published in the Proceedings of the 30th International Reliability Physics Symposium, March 1992, p. 211. Based on experimental evidence, an interconnection of length L will show electromigration immunity for an applied current density below a critical value $j_{cr}$. This $j_{cr}$ has been found to be inversely proportional to the interconnection length L. The above investigators of the short-length effect use various schemes to prove the existence of this phenomenon. However, these schemes do not utilize the self-aligned features and fine pitch which are essential for the manufacturability of Very Large and for Ultra Large Scale Integration circuits (VLSI and ULSI).

OBJECTS OF THE INVENTION

Accordingly, it is an object of the present invention to describe several methods and metallurgical structures that utilize the short-length phenomenon practiced in a VLSI and ULSI circuit environment.

It is another object of the present invention to provide an interconnection metallurgy having ultra small pitch and which is immune to electromigration failure.

It is a further object of the present invention to form an aluminum or copper metallurgy line having diffusion barrier interposed every 50 to 100 µm in series.

SUMMARY OF THE INVENTION

These and other objects are achieved with a method of providing interconnections to a semiconductor integrated chip, wherein the interconnections are designed to minimize electromigration, the method comprising the steps of: forming an interconnection with segments of a high conductivity metal interspersed with segments of a refractory metal, wherein each of the high conductivity metal segments is followed by one of the segments of refractory metal; and aligning the high conductivity metal and refractory metal segments with respect to each other, thereby ensuring electrical continuity.

The invention provides four distinct embodiments, each having a self-alignment feature, to achieve the desired metallurgical structure. In the first two, an aluminum segment is defined by an additive process, e.g., lift-off or Damascene, whereas a tungsten segment is defined by either an additive or a subtractive process. In the last two embodiments, the aluminum segment is defined by a subtractive process, e.g., Reactive-Ion-Etching (RIE), whereas the tungsten segment is defined either by an additive or a subtractive process.

BRIEF DESCRIPTION OF THE DRAWINGS

The foregoing and other objects, aspects and advantages will be better understood from the following detailed description of a preferred embodiment of the invention with references to the drawings, in which.

DETAILED DESCRIPTION OF THE PREFERRED EMBODIMENTS

Figure 1:
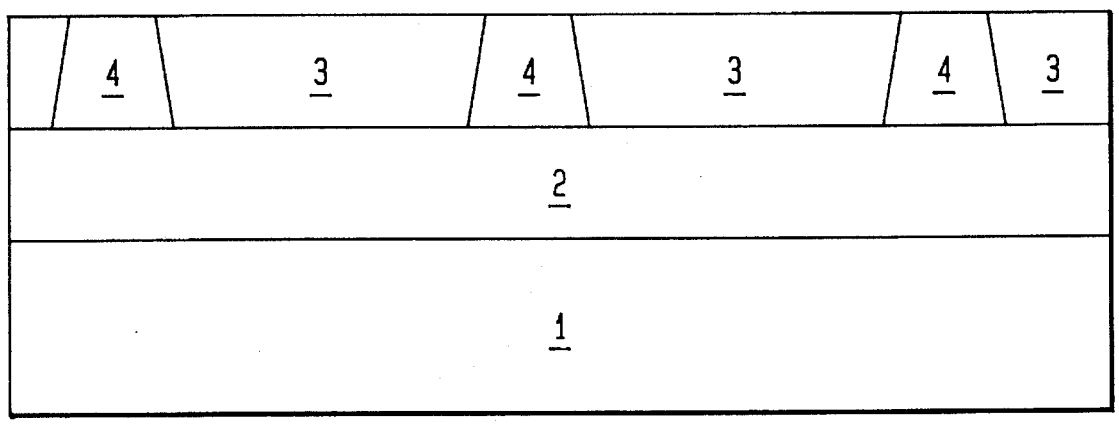
FIG. 1 shows a cross section of a desired end product according to the present invention that includes a silicon wafer with a passivation layer and aluminum segments of the metal line in series with tungsten segments.

Unless defined otherwise, all technical and scientific terms used herein have the same meaning as commonly understood by those of ordinary skill in the art to which this invention belongs. Although any methods and materials similar or equivalent to those described herein can be used in the practice or testing of the present invention, the methods and materials described herein are preferred. The materials, methods and examples are only exemplary and not limiting.

Referring now to the drawings, wherein like reference numerals represent the same or similar parts throughout, and more particularly, to layers 1 and 2 in all drawings, they respectively represent conventional substrate and passivating layers. To those skilled in the art, it should be apparent that the substrate could be a semiconductor wafer, wherein a plurality of devices (not shown) have been formed by conventional methods or, a substrate made of ceramic or organic material with or without interlayers of wiring channels. Likewise, the passivation layer could include inorganic or organic components or a combination thereof.

Figure 2A:
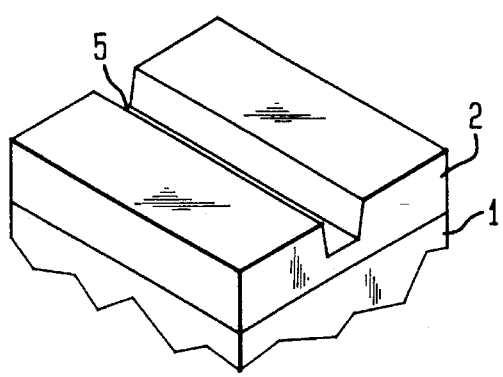
FIGS. 2a–2e show the desired end product of FIG. 1 at various stages of the manufacturing process thereof, according to one embodiment of the present invention, wherein both aluminum and tungsten segments are defined by a Damascene process.

Referring to FIG. 2a, a passivation layer 2 of $SiO_2$ is deposited over the surface of substrate 1. Trench 5 corresponds to an interconnection line pattern defined in a single or multi-layer structure of photoresist on top of the passivation layer 2. It is formed by reactively ion etching (RIE) the passivation layer 2 to a depth dictated by the required interconnection line thickness. While only one trench 5 is shown, it should be understood that more than one trench can be defined.

Figure 2B:
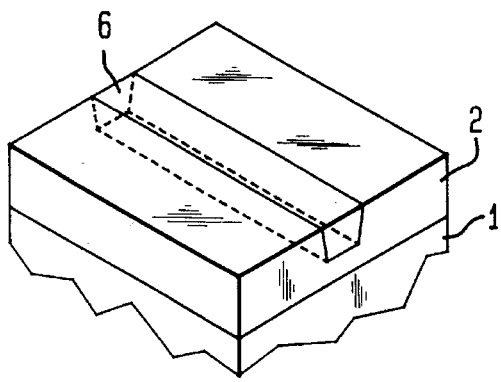

The next step of the process is to fill this trench (or trenches) with a diffusion barrier made of tungsten or any other similar refractory metal, such as molybdenum, tantalum, titanium, chromium, chromium/chromium oxide or any combination thereof as shown in FIG. 2b. This can be accomplished by first depositing a tungsten layer by CVD (Chemical Vapor Deposition) technique to a thickness at least equal to the depth of trenches 5, and removing excess tungsten by chemical-mechanical polish to leave a clean passivation surface 2 and a planarized tungsten filled trench (or trenches) 6.

Figure 2C:
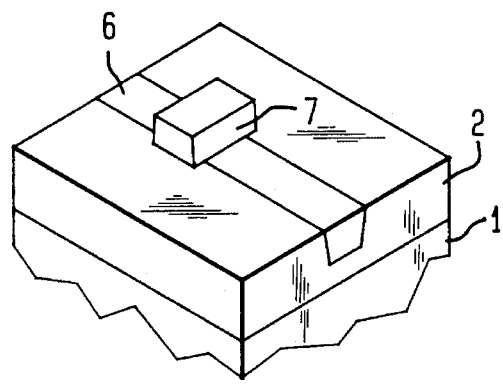
Figure 2D:
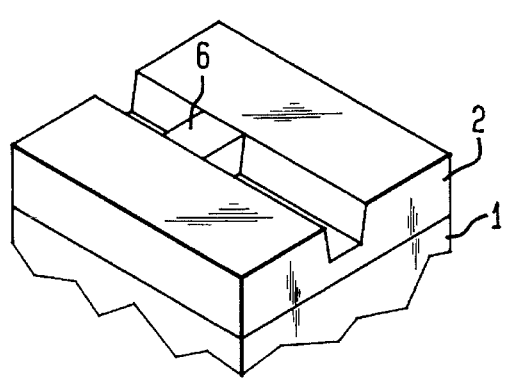
Figure 2E:
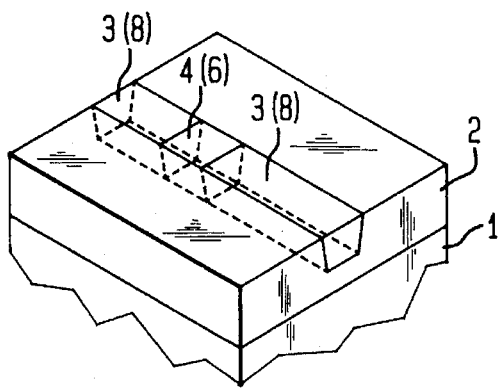

Photoresist is next applied and patterned to form a photoresist island 7 over a small portion of the tungsten line 6, as depicted in FIG. 2c. The exposed tungsten is then reactively ion etched away using fluorine based gas, thereby leaving short segments of tungsten 6(4) in the trenches shown in FIG. 2d. Next, a blanket layer of aluminum or aluminum alloy is deposited and chemical-mechanical polished to fill the rest of the trench with aluminum 8(3) as shown in FIG. 2e.

This process results in the desired interconnection pattern structure (FIG. 1) comprising alternate aluminum and tungsten segments wherein the two segments are advantageously self-aligned.

It should be evident to those skilled in the art that the above method could be modified by interchanging metals, the associated etches and the sequence of process. By way of example, aluminum (or aluminum alloy) or copper, could be first deposited, polished and patterned using a chlorine based reactive ion etch, leaving small segments of aluminum (or aluminium alloy or copper) in the trench. This would be followed by a deposition of tungsten or any other refractory metal, such as molybdenum, tantalum, titanium, chromium, chromium/chromium oxide or any combination thereof, followed by chemical-mechanical polish to remove any excess tungsten, thereby leaving the passivation layer 2 clean.

Figure 3E:
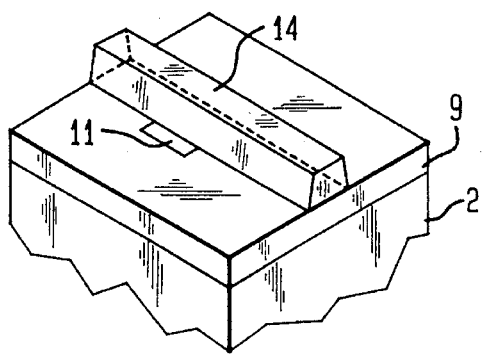
FIGS. 3a–3h show the desired end product of FIG. 1 at various stages of the manufacturing process thereof, according to another embodiment of the invention, wherein the aluminum segment is essentially defined by a reactive ion etching technique and the tungsten segment is defined by a Damascene technique.
Figure 3F:
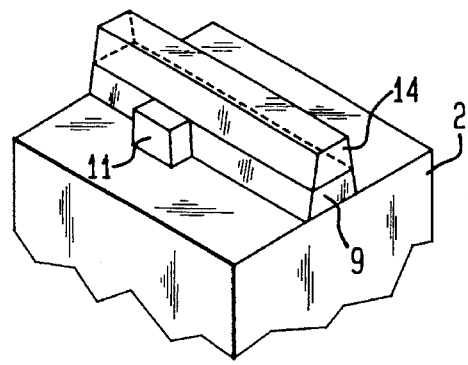
Figure 3G:
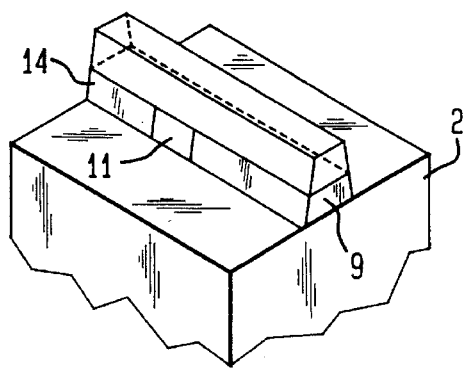
Figure 3H:
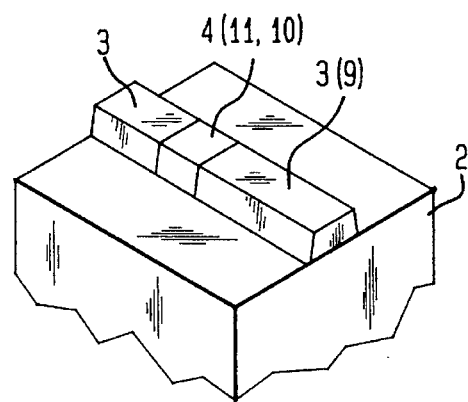
Figure 3A:
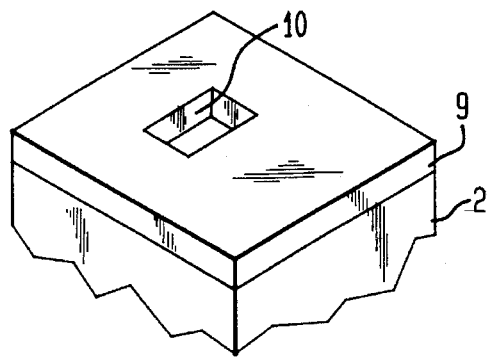

In another embodiment of this invention, a blanket layer of aluminum or its alloys 9, in FIG. 3a, is deposited and an array of holes 10 is formed by photomasking and reactively ion etching aluminum. The array is designed to be spaced no more than the minimum length of wire the circuit requires or 100 μm, whichever is less.

Figure 3B:
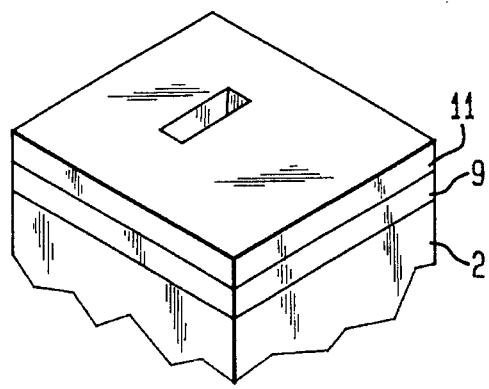
Figure 3C:
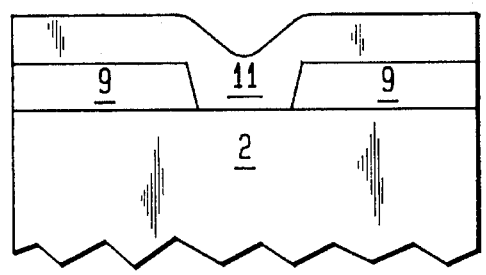
Figure 3D:
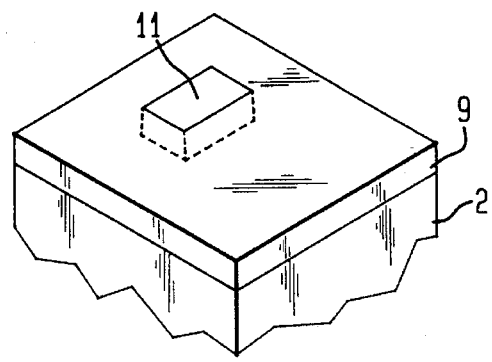

A tungsten layer 11 is next deposited to a thickness greater than the aluminum layer thickness (FIG. 3b and 3c). Excess tungsten 11 is chemical-mechanical polished until the aluminum surface 9 is exposed (FIG. 3d). This composite layer is then patterned for the required wiring by photomasking 14 (FIG. 3e), and aluminum is reactively ion etched in a chlorine based gas until the underlaying passivation surface 2 is clean (FIG. 3f). A fluorine based RIE is used to etch remove any tungsten protruding from the sides (FIG. 3g). After resist stripping, the desired wiring structure (FIG. 3h) is achieved.

With judicious combination of wiring and tungsten array layout, one may avoid having any protruding tungsten. Hence, fluorine based etching may not be required altogether.

The previously described embodiment can likewise be modified to first forming rectangular holes in tungsten by first depositing a layer of tungsten, patterning it as per the array pattern by appropriate photomasking, and reactively ion etching the tungsten with a fluorine based gas. The rectangle thus formed should preferably be such that its length exceeds the width of an interconnecting wire. Next, depositing a blanket layer of aluminum and polishing excess aluminun will result in a planarized surface of aluminum and tungsten. The desired wiring pattern is defined by photomasking and reactively ion etching the aluminum in a chlorine based gas. Any protruding tungsten is etched by fluorine based reactive etching.

Figure 4E:
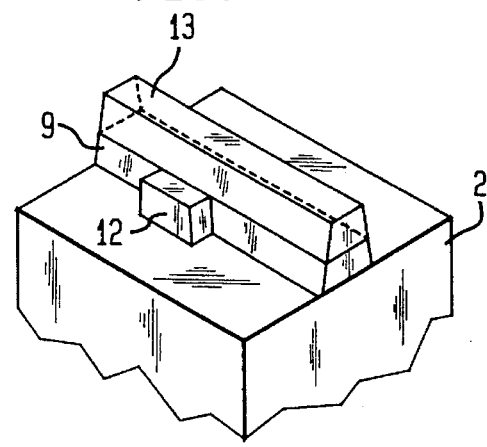
FIGS. 4a–4g show the desired end product of FIG. 1, at various stages of the manufacturing process thereof, according to yet another embodiment of the invention, wherein both aluminum and tungsten segments are fabricated using a subtractive etching technique, e.g., RIE.
Figure 4F:
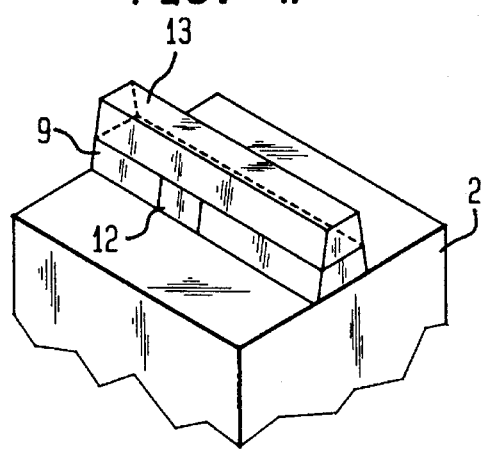
Figure 4G:
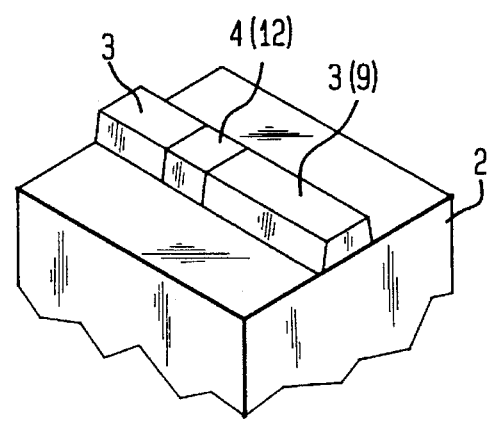
Figure 4A:
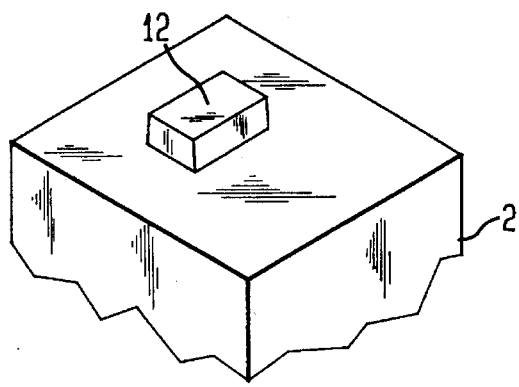
Figure 4B:
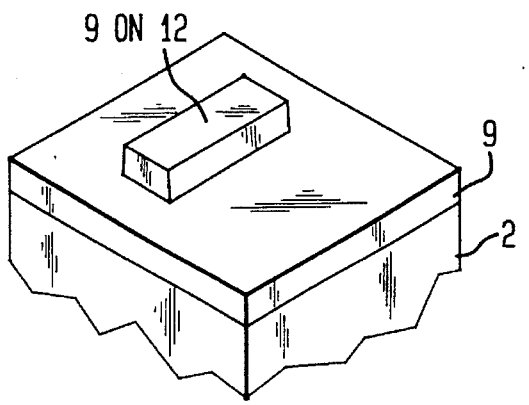
Figure 4C:
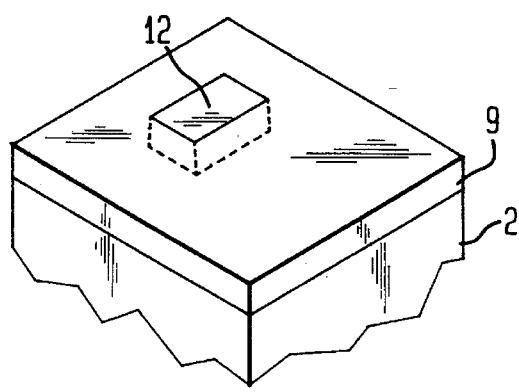
Figure 4D:
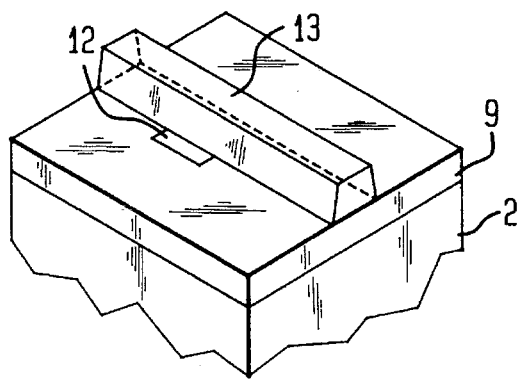

In yet another embodiment, a first tungsten island 12 in FIG. 4a is formed, and a blanket aluminum layer 9 (FIG. 4b) is deposited. The substrate is chemical-mechanical polished to planarize and expose the embedded tungsten 12 (FIG. 4c). A photoresist pattern 13, according to the desired wiring pattern is formed (FIG. 4d) and aluminum is reactively ion etched (FIG. 4e). The protruding tungsten 12 is reactively ion etched (FIG. 4f) and the resist mask 13 is removed, leaving self-aligned aluminum 3 and tungsten 4 segments in the desired wiring pattern (FIG. 4g). It should be emphasized that the intermediate structure of tungsten islands (FIG. 4a) in this embodiment could also be achieved by first subjecting the wafer to selective tungsten deposition by Chemical Vapor Deposition (CVD).

Any of the above-mentioned embodiments and modifications thereof result in desired wiring lines composed of aluminum or other similar high conductivity metal segments in series with self-aligned tungsten diffusion barrier segments, as illustrated in FIG. 1. Furthermore, the high conductivity metal may be comprised of an underlay (i.e., a thin layer of refractory metal lying under the high conductivity metal) or an overlay (i.e., a thin layer of refractory metal placed on top of the high conductivity metal), or both, underlay and overlay. The CVD tungsten, shown in FIG. 1, acts as the barrier material of choice, but any material in which aluminum diffusivity is small at processing temperatures, such as any of the refractory metals mentioned above, could also be used advantageously. For complete blockage of electromigration, the maximum aluminum segment length is current density dependent. The aluminum segment length decreases inversely as the current density increases. The increase in wiring line resistance caused by somewhat higher resistance of the diffusion barrier metal is usually less than 15 percent.

The examples and embodiments described herein are only exemplary and that various modifications or changes in light thereof will be suggested to persons skilled in the art and are to be included within the spirit and purview of this application and scope of the appended claims.

Having thus described our invention, what we claim as new and desire to secure by Letters Patent is as follows:

We claim:

1. A method of providing interconnections to a semiconductor integrated chip, wherein said interconnections are designed to minimize electromigration, said method comprising the steps of:
   forming islands of refractory metal on an insulated substrate at locations where an interconnection is to be made;
   inserting an aluminum island between every two adjoining said refractory metal islands, wherein
   said refractory metal islands alternating with said aluminum islands are serially connected to each other to ensure electrical continuity.

2. The method as recited in claim 1, wherein said refractory metal segments are selected from a group that consists of: tungsten, molybdenum, tantalum, titanium, chromium, chromium/chromium oxide and any combination thereof.

3. The method as recited in claim 1, wherein said aluminum islands are formed by a combination of metal etching and chemical-mechanical polishing, and wherein said refractory metal islands are formed by chemical-mechanical polish.

4. The method as recited in claim 1, wherein said refractory metal islands are formed by a combination of metal etching and chemical-mechanical polishing, and said aluminum islands are formed by chemical-mechanical polish.

5. A method of providing interconnections to a semiconductor integrated chip designed to minimize electromigration, said method comprises the steps of:
   forming refractory metal islands on top of a substrate at locations where an interconnection is to be made;
   depositing a blanket layer of aluminum on top of said substrate covering all said refractory metal islands;
   polishing said aluminum blanket layer until said refractory metal islands are exposed; and
   forming interconnections, by alternately connecting said exposed aluminum and said refractory metal islands, using photomasking and reactive ion etching.

6. The method of claim 5 wherein forming said refractory metal islands comprises depositing a layer of refractory metal, photomasking a pattern comprised of an array of islands and etching the refractory metal.

7. The method of claim 5 wherein said refractory metal islands are rectangular in shape, and wherein the length of the rectangle is longer than the width of an interconnecting line.

8. The method of claim 6 wherein said step of forming interconnections is performed by reactive ion etch in chlorine-based gas followed or preceded by reactive ion etch in fluorine-based gas.

9. A method of providing interconnections to a semiconductor integrated chip designed to minimize electromigration, said method comprises the steps of:
   forming an array of holes in a layer of aluminum by photomasking and aluminum etching;
   depositing a layer of refractory metal on top of said layer of aluminum;
   polishing the layer of refractory metal to expose aluminum thereby obtaining said layer of aluminum imbedded with refractory metal islands; and
   photomasking and etching said layer of aluminum imbedded with refractory metal islands, wherein interconnections comprised of alternating aluminum and refractory metal sections are formed.

10. The method as recited in claim 9, wherein said refractory metal is selected from a group that consists of: tungsten, molybdenum, tantalum, titanium, chromium, chromium-chromium oxide and any combination thereof.

11. The method of claim 9, wherein the refractory metal islands are rectangular in shape, and wherein the length of the rectangle is longer than a width of an interconnecting wire.

12. The method of claim 9, wherein said step of forming interconnections is performed by reactive ion etch in chlorine-based gas in combination with reactive ion etch in fluorine-based gas.

* * * * *